VARIABLE GAIN AMPLIFIER
Filed Aug. 15, 1966
FIG. 1. VARIABLE GAIN AMPLIFIER
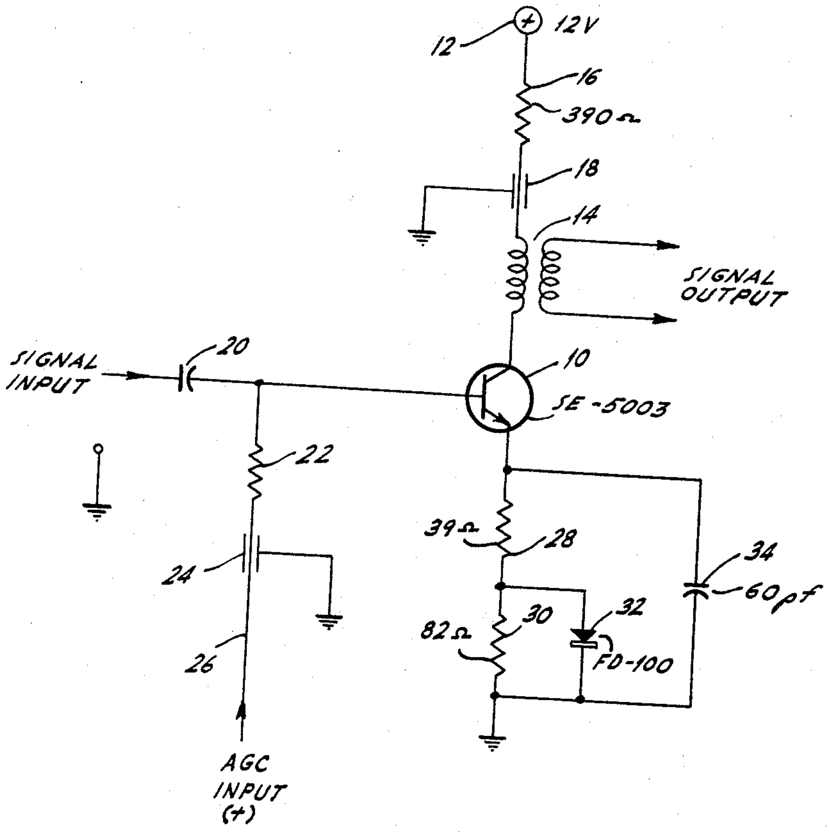
FIG. 2. GAIN CHARACTERISTIC OF AMPLIFIER (GAIN v. $V_{AGC}$)
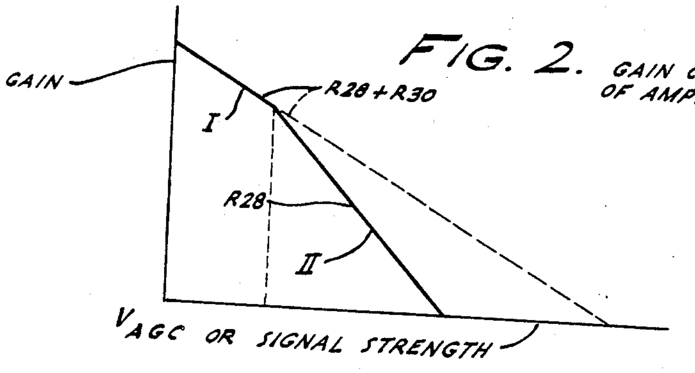
INVENTOR
WILLIAM W. LANCASTER
BY
D. P. Pressman
ATTORNEY

United States Patent Office 3,408,587

Patented Oct. 29, 1968

3,408,587

VARIABLE GAIN AMPLIFIER

William W. Lancaster, Philadelphia, Pa., assignor to Philco-Ford Corporation, Philadelphia, Pa., a corporation of Delaware Filed Aug. 15, 1966, Ser. No. 572,359

11 Claims. (Cl. 330—29)

ABSTRACT OF THE DISCLOSURE

Automatic gain-controlled transistor amplifier whose emitter circuit includes serially-connected resistors with a diode in parallel with one resistor. When weak input signals are received, AGC current will be low, creating a low emitter current which is insufficient to forward bias the diode, whereby full resistance of both resistors will be in series with emitter. High emitter impedance provides low AGC sensitivity for reduction of noise in output. Strong input signals create a high AGC current and hence a high emitter current which forward biases the diode, shorting out one resistor. Low emitter impedance provides a high AGC sensitivity for reduction of loading of AGC supply stage.

This invention relates to amplifiers and more particularly to a controllable gain amplifier having a particular gain control characteristic which makes the amplifier well suited for use as a radio frequency (RF) amplifier in a radio or TV receiver.

It is desirable and common to include an RF amplifying stage in radio and television receivers in order to provide increased sensitivity for better reception of weak signals. The gain (amount of amplification) of the RF stage and often the gain of one or more additional stages may be adjusted automatically by an AGC (automatic gain control) feedback circuit so that the gain of each controlled stage will be inversely proportional to the strength of the incoming signal. The AGC circuit usually derives a direct voltage (AGC voltage) which is proportional to incoming signal strength from one of the subsequent stages of the receiver and supplies this voltage as a bias to the controlled stages to adjust the gain thereof. The provision of an AGC circuit prevents overdriving of the receiver's stages or its output (the loudspeaker or picture tube) when strong signals are received. Also, AGC maintains the output level of the receiver sbstantially constant when the receiver is tuned to stations of different strength.

When weak signals are received, it is desirable that the gain of the RF amplifier stage be high and that its gain control sensitivity be relatively low, i.e., that a relatively small reduction in gain results from each incremental change in AGC voltage. The provision of high gain in the RF stage reduces the effect in the output of the receiver of noise generated inherently in the RF and mixer stages. This effect of internally generated noise is particularly objectionable at very low input signal levels, where the signal to noise ratio is lower.

When strong signals are received, it is desirable that the gain control sensitivity of the RF amplifier be very high, i.e., that a relatively large reduction in gain should result for a relatively small change in the AGC voltage. High gain control sensitivity reduces the AGC current requirement, thereby reducing loading of the stage from which the AGC voltage is derived. In addition, high gain control sensitivity will maintain the output signal level more nearly constant as the strength of the incoming signal varies.

Another desideratum of an RF amplifier stage is low harmonic and intermodulation distortion. This can be effected if the RF amplifier does not clip the input signal sharply in any operating range thereof. Heretofore sharp clipping occurred when the bias of the RF amplifier was changed by the AGC voltage to a point where the peaks of strong incoming signals drove the transistor into its cutoff region.

Accordingly, it is one object of the present invention to provide a gain controllable amplifier which has high gain control sensitivity in one portion of its controlled range and reduced gain control sensitivity in another portion of its controlled range. A concomitant object of the invention is to provide and RF amplifier which will reduce noise content in the output of a receiver in the presence of weak incoming signals while still providing good AGC performance in the presence of strong incoming signals.

Another object of the present invention is to provide a gain controllable RF amplifier with reduced harmonic and cross modulation distortion.

*Summary*

These and other objects of the present invention are achieved by the provision of an RF amplifier which includes an electronic valve, such as a transistor, which has two resistors serially connecting the common electrode thereof to one terminal of the bias source. The aforenoted variable gain control sensitivity feature is provided by shunting one of the resistors by a device which undergoes a change in impedance which is large enough to produce a substantial change in the combined impedance of the device and the shunted resistor when greater than a predetermined voltage is supplied thereacross. Distortion is reduced by supplying the AGC voltage to the input of the transistor in a manner which increases the forward bias of the transistor when stronger signals are received.

*Drawing*

FIG. 1 is a schematic diagram which shows a variable gain amplifier according to the invention.

FIG. 2 in a graph which shows the gain of the amplifier of FIG. 1 as a function of AGC voltage or incoming signal strength.

*Description of circuit*

The preferred embodiment of a variable gain amplifying stage according to the invention is shown in FIG. 1 with values or identifications of components indicated. This stage may be used most advantageously as an RF amplifier in a receiver because it has a variable gain characteristic of the type aforediscussed. However, it is not limited to this application but may be used wherever a controllable gain amplifier having the aforediscussed gain characteristic is desired.

The stage includes an NPN transistor 10 and a bias source 12, the negative terminal of which is connected to ground. The collector of transistor 10 is connected to the positive terminal of source 12 by way of the primary winding of a signal transformer 14 and a resistor 16. Resistor 16 improves AGC sensitivity by reducing the collector voltage of transistor 10 when more collector current is drawn. All of the components shown in the drawing, except resistor 16 and source 12, are desirably installed in a metal chassis. A capacitor 18, which may be a feedthrough capacitor which is installed at the point where the lead connecting the primary winding of transformer 14 to resistor 16 passes through the chassis, is utilized to prevent the RF signal from reaching resistor 16 and source 12. If the RF stage shown is part of a television receiver, transformer 14 may represent one of the transformers brought into operative association with the RF amplifier by the channel tuner.

The incoming RF signal is coupled to the base of transistor 10 by capacitor 20. An AGC voltage is also coupled to the base of transistor 10 by way of a resistor 22, which has a substantially higher value than the base-emitter circuit impedance of transistor 10 in order to prevent the AGC circuit from loading the input signal. A second capacitor 24, which again may be a feedthrough capacitor, is provided around the AGC lead 26 to decouple the RF amplifier from the AGC circuit.

The AGC voltage, which is supplied to lead 26 from a subsequent stage (not shown), is a positive voltage whose value is proportional to the strength of the output signal at the secondary of transformer 14. In a television receiver, the AGC voltage may be derived from the synchronizing pulses by gating and filtering the output of a direct-coupled video amplifier in conventional fashion. Since a positive-going AGC voltage is supplied to the base of an NPN transistor 10, the forward bias of transistor 10 will be increased in proportion to the strength of the output signal at the secondary winding of transformer 14.

The emitter of transistor 10 is connected to ground (the negative terminal of source 12) by means of serially connected resistors 28 and 30. Resistor 30 is shunted by a diode 32 and resistors 28 and 30 are bypassed by a capacitor 34. Diode 32, which may be a silicon diode having a forward offset voltage of about 0.6 volt, is poled so that it will conduct current from source 12 in the forward direction. In lieu of diode 32 any device may be used which undergoes a substantial change in impedance when a predetermined voltage is applied thereacross so as to produce a substantial change in the combined impedance of the device and resistor 30. In the case of the silicon diode, the impedance of device 32 changes from a value much higher than the impedance of resistor 30 to a value much lower than the impedance of resistor 30. Capacitor 34 provides a substantially infinite impedance to direct current and a substantially complete bypass to signal frequencies and hence prevents signal degeneration in the emitter circuit of the amplifier.

In lieu of NPN transistor 10, a PNP transistor can be used if the polarity of bias supply 12 is reversed and if the polarity and direction of the AGC signal are reversed. Under the latter conditions, the polarity of the diode 32 would be reversed. Also a vacuum tube may be used in lieu of transistor 10.

*Operation of circuit*

The operation of the circuit of FIG. 1 will be explained reference to the gain characteristic thereof shown in FIG. 2, which is divided into two sections, I and II, for purposes of explanation.

In section I the strength of the incoming signal is assumed sufficient to overcome the inherent threshold of the AGC circuit (not indicated) as as to generate a moderate AGC voltage on lead 26. An increase in the AGC voltage will increase the bias at the base of transistor 10 and thereby move the operating point of transistor 10 from its normal point (maximum gain) to a point nearer saturation at which less gain will be provided. Because the AGC voltage increases the forward bias of transistor 10 as the amplitude of the input signal increases, it is referred to as "forward" AGC. (In a conventional or "reverse" AGC circuit, the AGC voltage moves the operating point toward the cutoff point of the transistor as the signal strength increases.) The use of forward AGC in lieu of reverse AGC reduces harmonic and cross modulation distortion, since with forward AGC, the direct current supplied to the transistor is greater, allowing it to handle larger A.C. signals. Also, when forward AGC is used, the peaks of the incoming signal will drive the transistor deeper into saturation, where relatively gradual limiting rather than sharp clipping occurs.

When the amplifier is operating along section I of its gain characteristic, the AGC voltage will become more positive as the signal strength increases and will thereby reduce the gain of the stage at the rate indicated by the slope of the solid line labeled $R28+R30$. The slope of this line is governed by the value of emitter resistors 28 and 30, which constitute the effective DC impedance connecting the emitter of transistor 10 to ground. These resistors act to produce a relatively large amount of degeneration on the AGC voltage and thereby render the gain control sensitivity of the stage low. Diode 32 will play no part when the circuit is operating in section I since the voltage drop across resistor 30 will not be sufficient to overcome the forward offset voltage of diode 32.

When the input signal strength increases sufficiently so that the drop across resistor 30 will forward bias diode 32, operation in section II (the solid line designated R28) will occur. In section II diode 32 will have a far lower impedance than resistor 30 so that resistor 28 will effectively constitute almost the entire impedance connecting the emitter of transistor 10 to ground. The AGC voltage will consequently be degenerated less and hence will be more effective in reducing the gain of the circuit as indicated by the steeper slope of the gain characteristic in section II. In absence of diode 32 the slope of the gain characteristic would be similar to that in region I, as indicated by the broken line also labeled $R28+R30$.

It will thus be apparent that in the presence of strong incoming signals (section II) the gain control sensitivity of the amplifier will be high, thereby reducing AGC current requirements and providing a more constant output as signal strength varies. In the presence of weaker incoming signals (section I) the gain control sensitivity will be reduced and the gain of the RF stage will be high, thereby reducing noise content in the output of the receiver.

While there has been described what is at present considered to be the preferred embodiment of the invention it will be apparent that various modifications and other embodiments thereof will occur to those skilled in the art within the scope of the invention. Accordingly, it is desired that the scope of the invention be limited by the appended claims only.

I claim:

1. A gain controllable amplifier comprising:
(a) an electronic valve having input, common, and output electrodes,
(b) a direct current bias source having first and second terminals,
(c) means connecting said output electrode of said valve to said first terminal of said source, said means including an output terminal for said amplifier,
(d) means for supplying an input signal between one of said terminals of said source and said input electrode of said valve,
(e) means for varying the direct current potential of said input electrode of said valve in relation to the potential of said one terminal of said source, and
(f) voltage controlled variable impedance means, connected between said common electrode of said valve and said second terminal of said source, for causing the gain of said amplifier to decrease at a slower rate when said direct current potential of said input electrode of said valve is varied from a given value to a greater value than when said direct current potential is varied from said greater value to a still greater value.

2. The combination of claim 1 wherein said impedance means has a current versus voltage characteristic such that the current therethrough increases at a slower rate when the voltage thereacross is varied from a given value to a greater value than when said voltage varies from said greater value to a still greater value.

3. The combination of claim 2 further comprising a capacitor connected in parallel with said impedance means.

4. The combination of claim 2 wherein said impedance means comprises two serially-connected resistors and a diode, said diode being connected in parallel with one of said resistors, said diode having a forward offset potential and being poled to conduct direct current from said source in the forward direction.

5. The combination of claim 4 further comprising a capacitor connected in parallel with said two serially-connected resistors.

6. The combination of claim 1 wherein said (e) means comprises a forward automatic gain control circuit arranged to vary the potential of said input electrode of said valve in proportion to the amplitude of the output signal of said amplifier.

7. A controllable gain amplifier, comprising:

(a) a source of direct current bias potential;

(b) a transistor having base, emitter, and collector electrodes, (c) a load impedance connecting the collector electrode of said transistor to one terminal of said source, (d) means for supplying an input signal between said base electrode and the other terminal of said source, (e) means for varying the direct current bias potential of said base terminal, and (f) a pair of resistors serially connected between said emitter and said other terminal of said source, one of said resistors being paralleled by a device which has (1) a relatively high resistance when less than a predetermined potential is applied thereacross and (2) a relatively low resistance when greater than said predetermined potential is applied thereacross.

8. The amplifier of claim 7 wherein said device is a diode having a forward offset potential and poled to pass current in the forward direction from said source.

9. The amplifier of claim 7 wherein said (e) means comprises a forward automatic gain control circuit arranged to vary the potential difference between said base electrode and the other terminal of said source so as to increase the forward bias of said transistor in proportion to the magnitude of the signal across said load impedance.

10. The amplifier of claim 7 wherein said two resistors are capacitively bypassed.

11. The amplifier of claim 7 wherein said load impedance comprises a transformer, the primary winding thereof being connected in circuit between said collector electrode and said one terminal of said source, said (e) means comprises a forward automatic gain control circuit arranged to vary the potential between said base and said other terminal of said source so as to increase the forward bias of said transistor in proportion to the magnitude of the signal across said load impedance, said device of clause (f) is a diode having a forward offset potential and poled to conduct current from said source in the forward direction, and wherein said two resistors are capacitively bypassed.

References Cited

UNITED STATES PATENTS

| | | | |
|---|---|---|---|
| 2,897,353 | 7/1959 | Schweiss | 250—20 |
| 3,014,186 | 12/1961 | Webster | 330—24 |
| 3,234,469 | 2/1966 | Gunn | 325—319 X |
| 3,309,617 | 3/1967 | Lancaster et al. | 330—29 X |

ROY LAKE, *Primary Examiner.*

J. B. MULLINS, *Assistant Examiner.*